United States Patent [19]
Nomura

[11] Patent Number: 6,084,760
[45] Date of Patent: Jul. 4, 2000

[54] DEVICE FOR DRIVING SELF ARC-EXTINGUISHING TYPE POWER ELEMENT

[75] Inventor: Yoshihito Nomura, Hachioji, Japan

[73] Assignee: Kabushiki Kaisha Toshiba, Kawasaki, Japan

[21] Appl. No.: 09/147,686

[22] PCT Filed: Jun. 19, 1998

[86] PCT No.: PCT/JP98/02751

§ 371 Date: Feb. 16, 1999

§ 102(e) Date: Feb. 16, 1999

[87] PCT Pub. No.: WO98/59412

PCT Pub. Date: Dec. 30, 1998

[30] Foreign Application Priority Data

Jun. 20, 1997 [JP] Japan ...................................... 9-163604

[51] Int. Cl.[7] ..................................................... H02H 3/22
[52] U.S. Cl. ......................... 361/111; 361/91.4; 361/91.5
[58] Field of Search .................................. 361/111, 91.4, 361/91.1, 91.5, 91.7, 118

[56] References Cited

U.S. PATENT DOCUMENTS

4,949,213  8/1990  Sasagawa et al. ..................... 361/91.4

*Primary Examiner*—Michael J. Sherry
*Attorney, Agent, or Firm*—Oblon, Spivak, McClelland, Maier & Neustadt, P.C.

[57] ABSTRACT

A circuit for driving a self-arc-extinguishing type power element 1 such as an IGBT, includes a signal supply circuit 7 for supplying an ON/OFF signal to the power element 1, an insulation circuit 5 for insulating an output signal of the signal supply circuit 7, a control section 100 for controlling rise time or fall time of a current flowing through the power element 1 based on an output of the insulation circuit 5, and a power amplifier 2, 3, 4 for driving the power element 1 based on an output of the control section 100.

10 Claims, 6 Drawing Sheets

DEVICE FOR DRIVING SELF ARC-EXTINGUISHING TYPE POWER ELEMENT

FIELD OF INVENTION

The present invention relates to a unit for driving a self-arc-extinguishing type power element such as an IGBT (Insulated Gate Bipolar Transistor) used in an inverter device and the like.

DISCUSSION OF THE BACKGROUND

A long time has passed since a power element in the general industrial field, was adopted in general household electrical appliances, equipment for public use, and the like. This kind of power element has recently been required to operate with high efficiency, at high speed and with a low loss, and tends to perform its switching operation at higher and higher speed.

Figure 1:
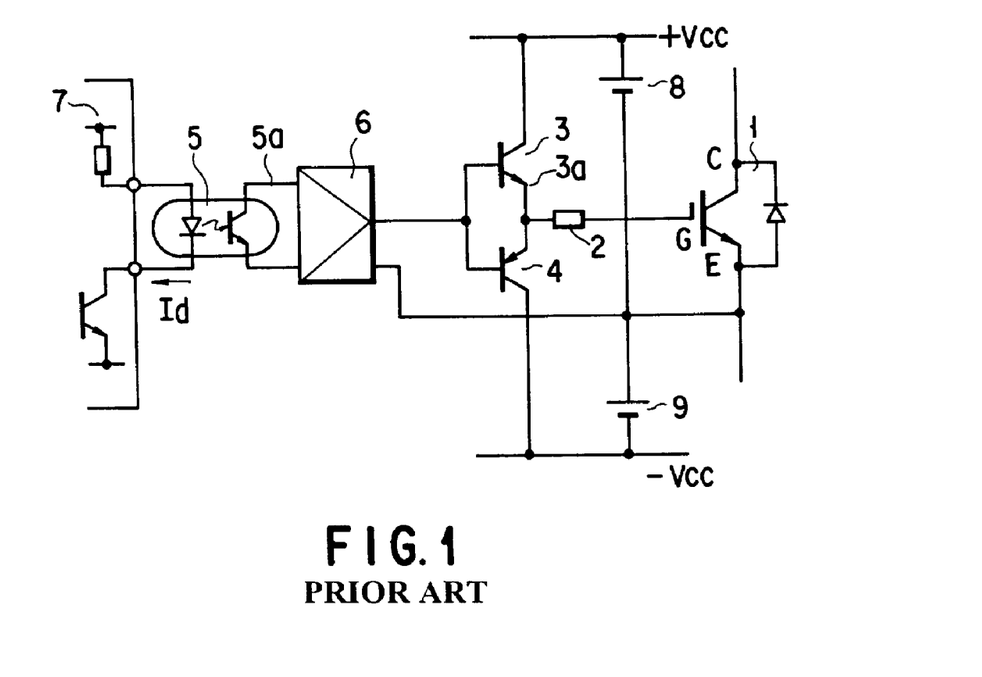
FIG. 1 is a circuit diagram of a prior art self-arc-extinguishing type power element driving unit.
Figure 3A:
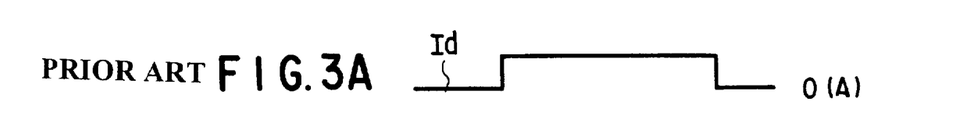
FIGS. 3A to 3F are waveform diagrams showing timing of each element of the prior art self-arc-extinguishing type power element driving unit.
Figure 3B:
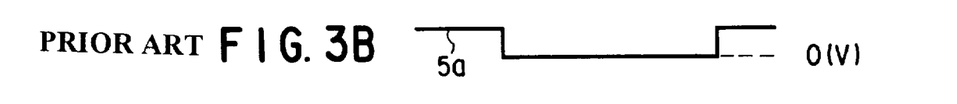

One example of a prior art self-arc-extinguishing type power element driving unit will be described with reference to FIG. 1. The unit illustrated in FIG. 1 is one for driving a typical IGBT 1 as a self-arc-extinguishing type power element. A signal supply circuit 7 generates an on/off signal Id for driving the power element as shown in FIG. 3A. The output of the signal supply circuit 7 is supplied to the gate of the IGBT 1 through a photocoupler 5, an amplifier 6, and a power amplifying circuit including a driving gate resistor 2 and NPN type transistors 3 and 4. The reason for employing the photocoupler 5 is that the IGBT 1 has to be insulated from the driving unit side since the IGBT 1 is connected to a main circuit and turned on/off at high voltage and changes its emitter potential to a high potential in an example of an inverter bridge. Since, furthermore, the insulation output of the photocoupler 5 is a small signal one, it needs to be amplified and thus the amplifier 6 is provided to do so.

Figure 3C:
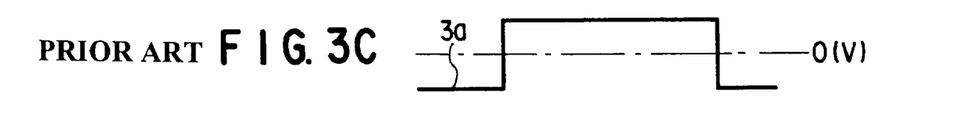

An operation of the driving unit shown in FIG. 1 will be described with reference to FIGS. 3A to 3F. The power element driving on/off signal Id, as shown in FIG. 3A, is generated from the signal supply circuit 7 to turn on/off the primary side of the photocoupler 5. As a result, when the photocoupler 5 is turned on, a current flows into a light-emitting diode which is a light-emitting section of the photocoupler 5, and thus the light-emitting section emits light. If a light-receiving section of the photocoupler 5 receives the signal, an insulation output 5a flows. The potential of output 5a of photocoupler 5 is equal to logic "0" when the photocoupler 5 is turned on. The output 5a of the photocoupler 5 is supplied to the amplifier 6 and power-amplified by the transistors 3 and 4. Then, as shown in FIG. 3C, the outputs of the transistors 3 and 4 or the potential of the gate resistor 2 is set to a value of approximately $+V_{CC}$ or $-V_{CC}$ relative to the emitter potential of the IGBT 1. The potentials $+V_{CC}$ and $-V_{CC}$ of the gate resistor 2 are set by power supplies 8 and 9.

Figure 2:
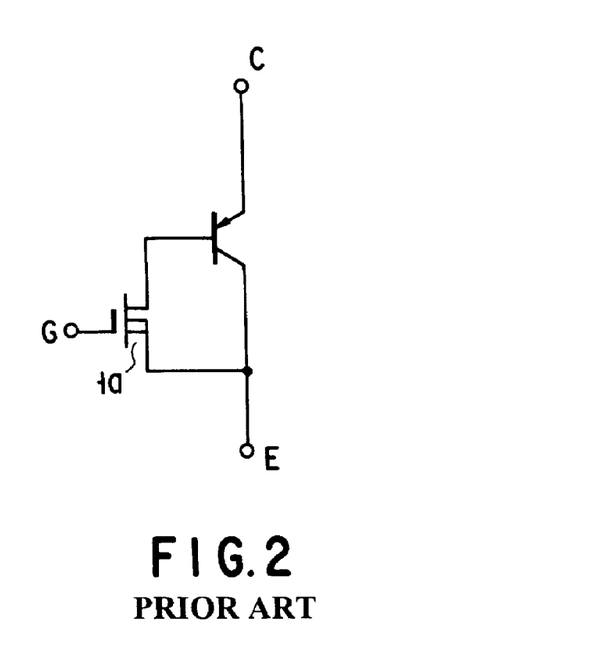
FIG. 2 is an equivalent circuit diagram of an IGBT as an example of the self-arc-extinguishing type power element driving unit.

An equivalent circuit of the IGBT 1 is illustrated in FIG. 2 as a typical example of the power element. The gate input section of the IGBT 1 constitutes an FET (Field Effect Transistor) 1a, and the gate-to-source thereof is high in impedance but has capacitive characteristics.

Figure 3D:
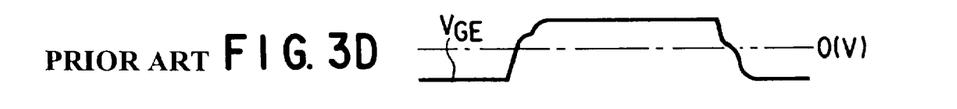
Figure 3E:
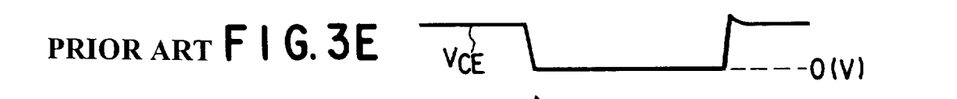
Figure 3F:
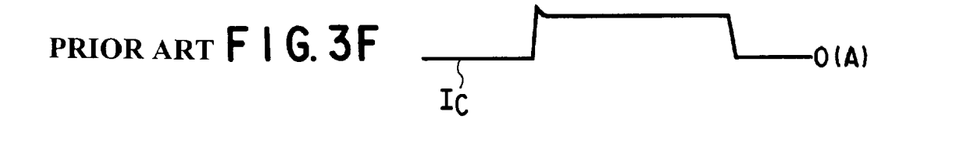

Consequently, the gate potential of the IGBT 1 has a capacitive potential and thus varies with the gate resistor 2 and the time constant of input capacitance. The IGBT 1 is turned on/off in response to the on/off signal generated from the driving unit and thus the respective elements of the IGBT 1 make/brake the current of the main circuit based on the waveforms indicated in FIGS. 3D to 3F. FIG. 3D shows a gate-to-emitter potential $V_{GE}$, FIG. 3E represents a collector-to-emitter potential $V_{CE}$ and FIG. 3F illustrates a collector current.

However, in the prior art self-arc-extinguishing type power element driving unit, a current variation di/dt at the time of ON/OFF of the current flowing into the main circuit is raised as one problem. There is an inverter as a device to which the power element is applied. If such an inverter requires a large amount of electric power, it always has an inductance in the main circuit in view of the constitution of hardware.

For this reason, a surge voltage is generated based on Ldi/dt by the current variation di/dt at the time of switching, and an EMI (Electron Magnetic Interference) is caused due to the surge voltage.

As described above, a voltage variation $dV_{CE}/dt$ of the collector-to-emitter potential $V_{CE}$ at the time of switching causes a problem of EMI.

Especially in the case of a power element performing a high-speed switching operation, dV/dt is increased to cause a problem of a higher-frequency electromagnetic interference.

SUMMARY OF THE INVENTION

An object of the present invention is to provide a self-arc-extinguishing type power element driving unit for suppressing an EMI due to dV/dt caused when the a power element performs its switching operation.

The above object is attained by the following unit:

A unit for driving a self-arc-extinguishing type power element having a collector, an emitter and a gate, comprising:

a signal generation circuit for generating a signal for turning on/off the power element;

an insulation circuit for electrically insulating an output of the signal generation circuit and generating the insulated output;

a control section for turning on/off the power element based on the output removed from the insulation circuit, and generating a signal for suppressing a surge voltage when the power element is turned on/off; and a power amplifier having a gate resistor, for amplifying the signal generated by the control section and supplying an amplified signal to the gate of the power element through the gate resistor.

DETAILED DESCRIPTION OF THE PREFERRED EMBODIMENTS

Figure 4:
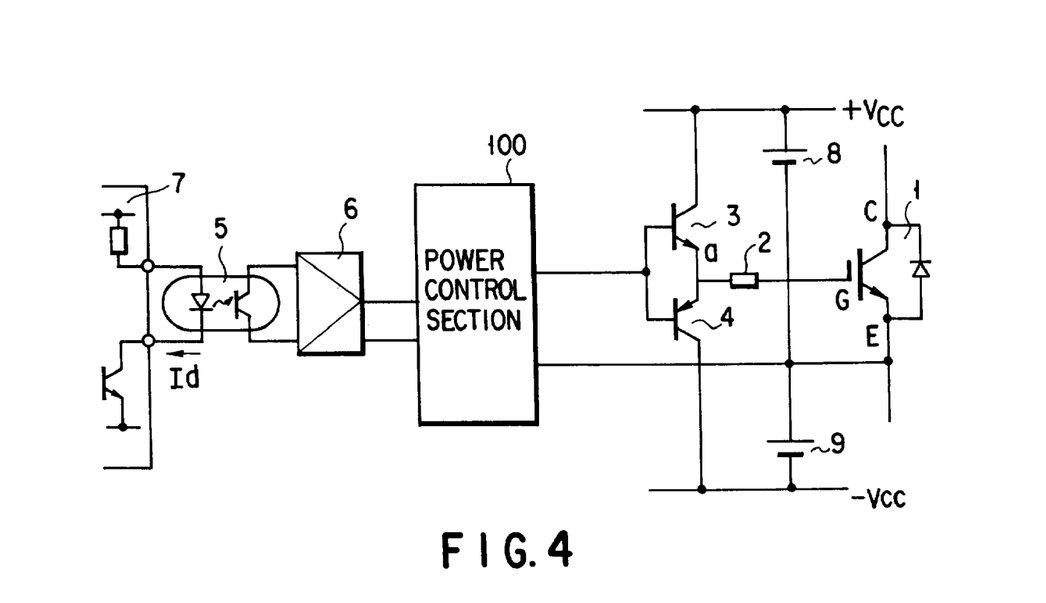
FIG. 4 is a circuit diagram illustrating a self-arc-extinguishing type power element driving unit of the present invention.

The principle of the present invention is featured in that, as shown in FIG. 4, a control section 100 for generating a signal for suppressing a surge voltage when a power element performs its switching operation, is provided between an amplifier 6 and a power amplifier circuit including transistors 3 and 4. The following embodiments disclose various types of control sections according to the present invention.

A first embodiment will be described with reference to FIGS. 5 and 6A to 6F. In FIGS. 5 and 6A to 6F, the same elements as those of FIGS. 1 and 3A to 3F are denoted by the same reference numerals and their descriptions are omitted. A control section 100A of this embodiment has an integration circuit. This integration circuit is constituted of an operational amplifier 17, resistors 12 to 16, a capacitor 26, and Zener diodes 20 and 21. The integration circuit is connected to power supplies $+V_{CC}$ and $-V_{CC}$ via load resistors 23 and 24. An amplifying circuit including an operational amplifier 22 and resistors 18 and 19 is connected to the integration circuit. Moreover, a variable resistor 25 is connected to an amplifier 11 in order to adjust an output of the amplifier 11. The capacity of the amplifier 11 of the first embodiment can be set smaller than that of the amplifier 11 of the prior art.

An operation of the unit of the first embodiment will be described with reference to FIGS. 6A to 6F. The amplifier 11 outputs an arbitrary positive voltage when a current flows through the primary side of a photocoupler 5, and outputs an arbitrary negative voltage when the current is cut off. These arbitrary output voltages can be varied by the variable resistor 25 and serve as a current command value of the operational amplifier 17.

Figure 5:
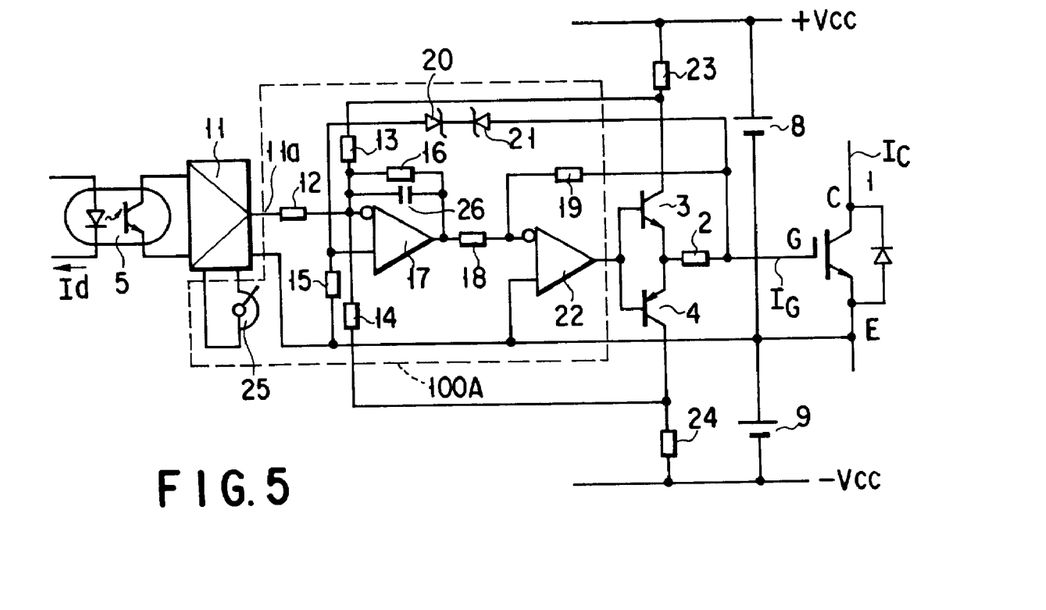
FIG. 5 is a circuit diagram of a self-arc-extinguishing type power element driving unit according to a first embodiment of the present invention.
Figure 6A:
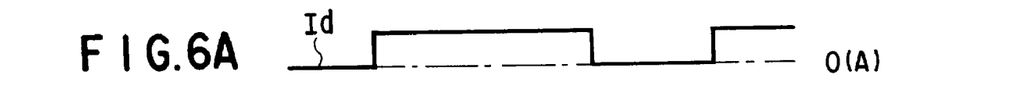
FIGS. 6A to 6F are waveform diagrams showing timing of each element of the unit illustrated in FIG. 5.
Figure 6B:
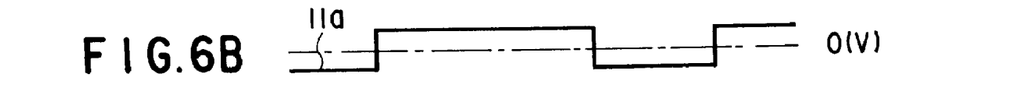
Figure 6C:
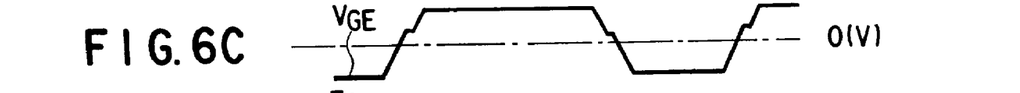
Figure 6D:
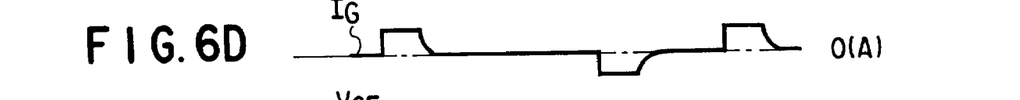
Figure 6E:
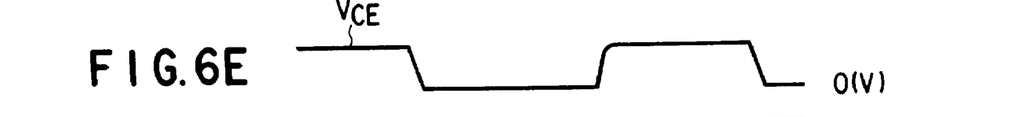
Figure 6F:
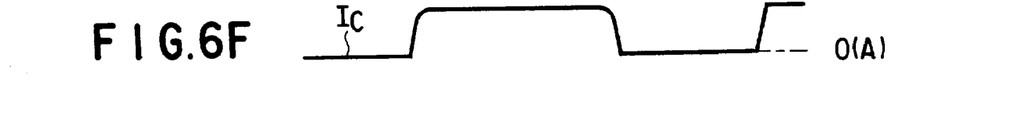

An inversion input of the operational amplifier 17 is connected to the load resistors 23 and 24 of the operational amplifier 22 via resistors 13 and 14. In other words, the current of a positive output of the operational amplifier 22 is detected by the resistor 23 and that of a negative output of the amplifier 22 is detected by the negative resistor 24, and these detected values are negatively fed back to the operational amplifier 17 through the resistors 13 and 14.

As described above, an output of the amplifier 11 serving as a current reference and a difference in voltage between both ends of the resistors 23 and 24 serving as a current feedback, are operation-amplified by the operational amplifier 17 and determined as a voltage reference of the operational amplifier 22. The resistor 18 is an input resistor of the operational amplifier 22, while the resistor 19 is a feedback resistor thereof. The output voltage of the operational amplifier 22 is thus applied to the IGBT 1 as a gate voltage.

Since the operational amplifier 17 constitutes an integration circuit together with the capacitor 26 connected thereto, it integrates an error. The output of the operational amplifier 22 is saturated to a value which is close to the power supply voltages $+V_{CC}$ and $-V_{CC}$, and set to a fixed potential by the Zener diodes 20 and 21.

According to the unit of the first embodiment described above, a gate current corresponding to the current reference can be supplied to the IGBT 1 to control the rise time of the main circuit current when the IGBT 1 is turned on. Similarly, the gate current can also be supplied to the IGBT 1 to control the rise time of the main circuit current when the IGBT 1 is turned off. If, when the IGBT 1 performs its switching operation, the above current control is executed to saturate or unsaturate the IGBT 1 or to clamp the gate voltage after the switching operation is completed, thereby stopping the constant current control.

Consequently, as shown in FIGS. 6A to 6F, di/dt is controlled and suppressed and thus dV/dt of the surge voltage generated by the main circuit current Ldi/dt is suppressed; accordingly, the EMI is suppressed.

The present invention can be applied to only the control of the rise time of current flowing through the power element, only the control of the fall time, or both the control of the rise time and that of the fall time.

A second embodiment of the present invention will be described with reference to FIGS. 7 and 8A to 8F. In these figures, the same elements as those of FIGS. 5 and 6A to 6F are indicated by the same reference numerals. In a control section 100B of the second embodiment, an operational amplifier 17 constitutes a complete integration circuit together a resistor 12 and a capacitor 2. The other constitution is the same as that of FIG. 5.

Figure 7:
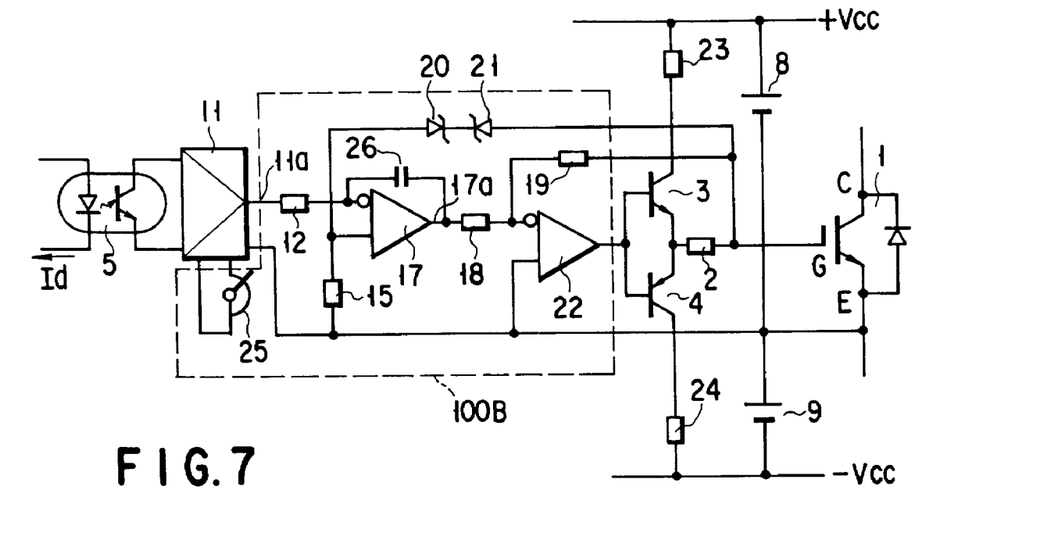
FIG. 7 is a circuit diagram of a self-arc-extinguishing type power element driving unit according to a second embodiment of the present invention.
Figure 8A:
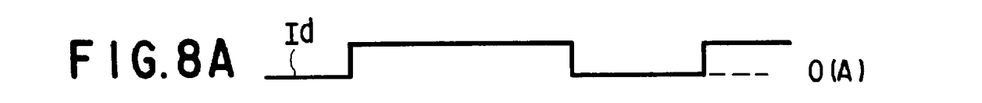
FIGS. 8A to 8F are waveform diagrams showing timing of each element of the unit illustrated in FIG. 7.
Figure 8B:
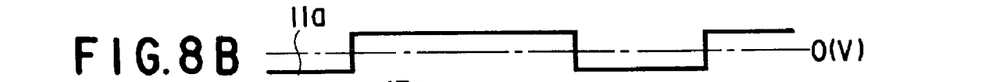
Figure 8C:
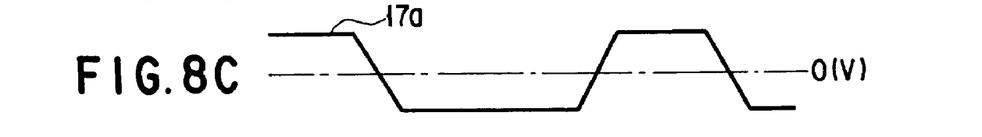
Figure 8D:
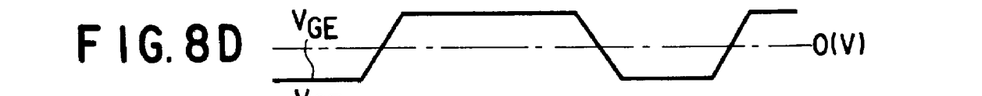
Figure 8E:
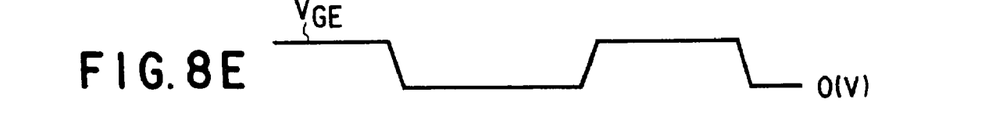
Figure 8F:
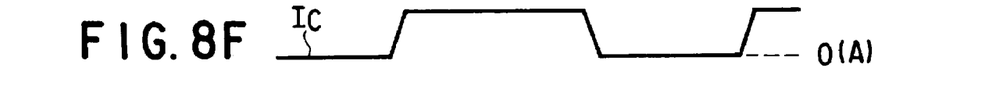

In the second embodiment, if the primary current of a photocoupler 5 flows, the output thereof is equal to logic "0" and supplied to an amplifier 11. The output is converted and amplified and becomes an arbitrary positive potential. If the primary current of the photocoupler 5 is cut off, the output thereof is equal to logic "1". The output is converted and amplified by the amplifier 11, and becomes an arbitrary negative potential. Furthermore, the output of the amplifier 11 can be varied by a variable resistor 25.

The operational amplifier 17 constitutes a complete integration circuit together with the resistor 12 and capacitor 26. The output of the operational amplifier 17 is linearly varied with the time constant determined by the resistor 12 and capacitor 26. Zener diodes 20 and 21 are used to clamp the output voltage of the operational amplifier 17 so as to prevent the output voltage from exceeding a predetermined value of the positive or negative potential. The operational amplifier 22, resistors 18, 19, 23 and 24 and transistors 3 and 4 constitute a DC operational amplifying circuit, and the output of the amplifying circuit becomes an output voltage corresponding to the input voltage of the operational amplifier 22. This voltage is applied to the IGBT 1 as a gate voltage.

In the unit of the second embodiment, when the primary current flows through the photocoupler 5, the output of an integrator constituted of the operational amplifier 17 and capacitor 26 is varied with a fixed value of dV/dt and clamped by a clamping potential. If the current is cut off, the output is lowered as in the OFF operation. This output is power-amplified by the operational amplifier 22 in the subsequent stage and thus applied to the gate terminal. It is needless to say that dV/dt can be varied by taking consideration variations in polarity due to the operational amplifier and by the resistor 25.

If, as described above, the gate voltage of the IGBT 1 is varied such that dV/dt is fixed, a variation di/dt in the collector-to-emitter current can be suppressed when the IGBT 1 is switched on/off. Moreover, a switching surge voltage due to Ldi/dt can be suppressed and so can be the EMI.

A third embodiment of the present invention will be described with reference to FIGS. 9 and 10A to 10F. In these figures, the same elements as those of FIGS. 7 and 8A to 8F are indicated by the same reference numerals. The control section 100B of the third embodiment is the same as that shown in FIG. 7, and an IGBT 27 including a pilot IGBT 27' is employed as a power element, in place of the IGBT 1 shown in FIG. 7. The pilot IGBT 27' detects a current which is proportionate to the main current flowing between the collector and emitter of the IGBT 27 serving as the main element. For example, at a ratio of 1000 to 1, a current of 100 A flows through the IGBT 27, while a current of 0.1 A flows through the pilot IGBT 27'.

Figure 9:
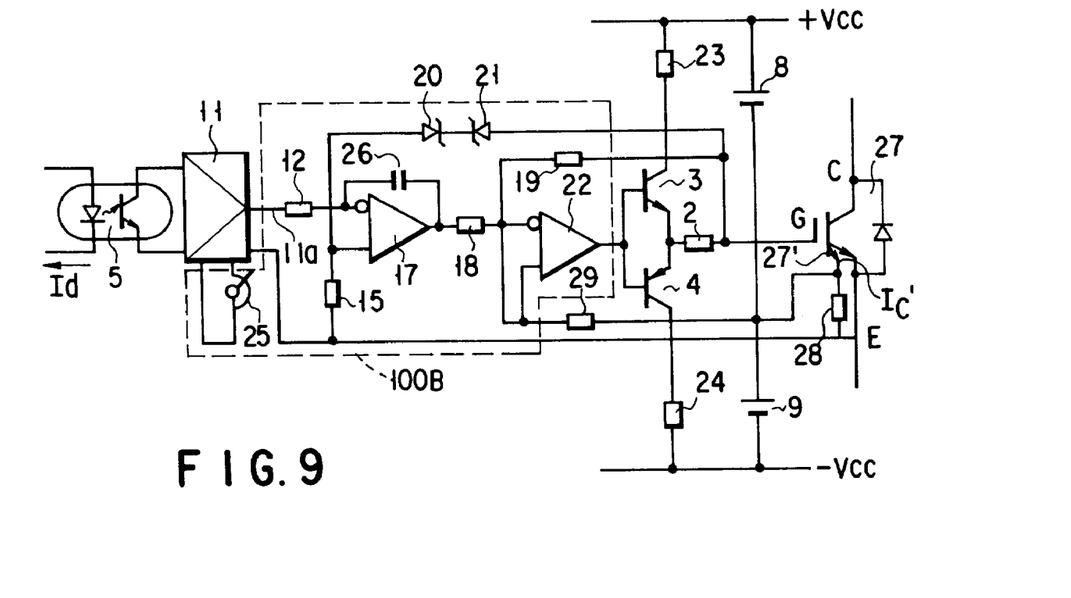
FIG. 9 is a circuit diagram of a self-arc-extinguishing type power element driving unit according to a third embodiment of the present invention.
Figure 10A:
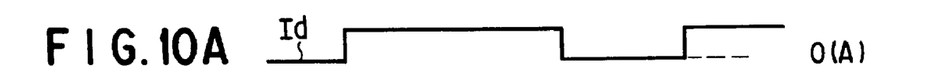
FIGS. 10A to 10F are waveform diagrams showing timing of each element of the unit illustrated in FIG. 9.
Figure 10B:
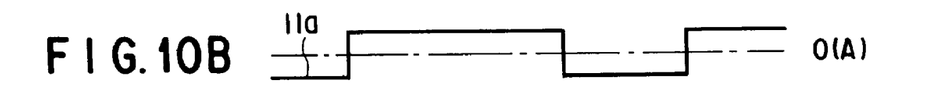
Figure 10C:
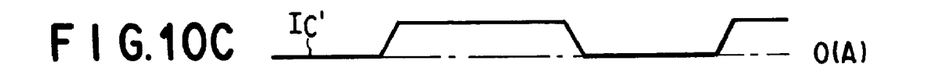
Figure 10D:
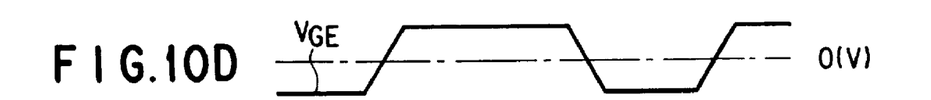
Figure 10E:
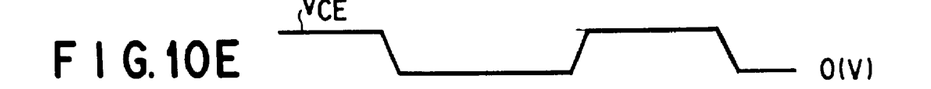
Figure 10F:
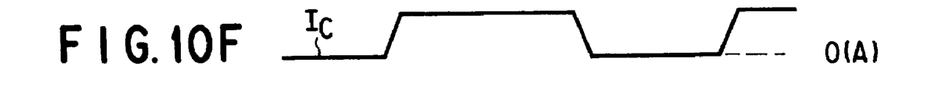

A resistor 28 is connected in series to the emitter of the pilot IGBT 27', and the voltage of the resistor 28 is dropped in proportion to the current flowing through the pilot power IGBT 27' and becomes a current detection signal which is proportionate to the main current.

An operation of the unit according to the third embodiment having the above constitution, will now be described. In FIG. 5 illustrating the above-described first embodiment, a current flowing to the gate terminal is fixed. In the third embodiment, however, the current flowing through the pilot IGBT 27' corresponds to the current reference of the input of the operational amplifier 22.

The operational amplifier 17 constitutes an integration circuit together with a capacitor 26 connected thereto. The output of the integration circuit linearly increases or decreases based on the time constants of the resistor 12 and capacitor 26 in accordance with the output voltage of an amplifier 11.

In other words, the gate voltage is so controlled that, when the IGBT 27 is turned on or turned off, the main circuit current flows in accordance with the current reference which is an output of the integration circuit.

The steady-state value of the gate voltage at the time of the ON/OFF operation is clamped by Zener diodes 20 and 21. Since, therefore, the gate voltage is clamped by the steady-state value, a delay in turn-on and turn-off due to saturation of the amplifier 11 can be prevented.

Figure 11:
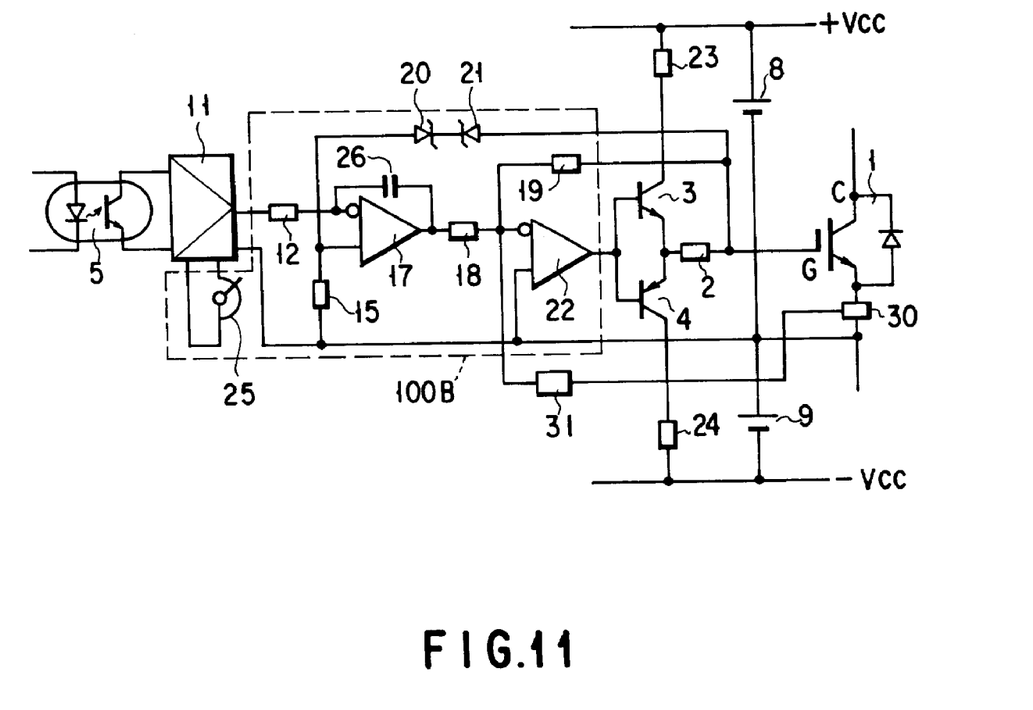
FIG. 11 is a circuit diagram of a self-arc-extinguishing type power element driving unit according to a fourth embodiment of the present invention.

As illustrated in FIG. 11, a Hall effect current transformer 30 is provided on the emitter side of the IGBT 1, in place of the IGBT 27 including the pilot IGBT 27' as shown in FIG. 10, and an output of the Hall effect current transformer 30 can be connected to an inversion terminal of the operational amplifier 22 through a resistor 31. With this constitution, a detection current value according to the main current by the IGBT 1 is detected by the Hall effect current transformer 30, and the detected value can be supplied to the operational amplifier 22 as in the case of FIG. 10, and the same advantage as that in FIG. 10 can be obtained.

As described above, the present invention makes it possible to suppress an EMI due to dV/dt which is caused when a power element, such as an IGBT, performs its switching operation.

What is claimed is:

1. A unit for driving a self-arc-extinguishing power element having a collector, an emitter, and a gate, comprising:
    a signal generation circuit which generates a signal for turning on/off the power element;
    an insulation circuit configured to insulate an output of the signal generation circuit electrically and to generate an insulation output signal;
    a power amplifier having a gate resistor and configured to amplify a control signal and to supply an amplified signal to the gate of the power element through the gate resistor; and
    a control section configured to turn on/off the power element based on the insulation output signal and to generate the control signal for suppressing a surge voltage when the power element is turned on/off, comprising,
        means for generating a signal for controlling at least one of rise time and fall time of a current flowing through the power element, based on the insulation output signal.

2. The unit according to claim 1, wherein the power amplifier includes:
    a load resistor; and
    the control section includes,
        means for generating a signal for controlling at least one of rise time and fall time of a current flowing through the power element, based on a voltage value dropped by the load resistor.

3. A unit for driving a self-arc-extinguishing power element having a collector, an emitter and a gate, comprising:
    a signal generation circuit which generates a signal for turning on/off the power element;
    an insulation circuit configured to insulate an output of the signal generation circuit electrically and to generate an insulation output signal;
    a power amplifier having a gate resistor and configured to amplify a control signal and to supply an amplified signal to the gate of the power element through the gate resistor; and
    a control section configured to turn on/off the power element based on the insulation output signal and to generate the control signal for suppressing a surge voltage when the power element is turned on/off, comprising,
        an integration circuit provided on an output side of the insulation circuit, and
        means provided on an output side of the integration circuit, for, when a gate voltage of the power element reaches a predetermined potential, stopping an operation of the integration circuit and generating a signal for improving a delay in time for a switching operation of the power element, based on a mismatch between the integration circuit and the power amplifier.

4. A unit for driving a self-arc-extinguishing power element having a collector, an emitter, a gate, and an intrinsic capacitance comprising:
    a signal generation circuit which generates a signal for turning on/off the power element;
    an insulation circuit configured to insulate an output of the signal generation circuit electrically and to generate an insulation output signal;
    a power amplifier having a gate resistor and configured to amplify a control signal and to supply an amplified signal to the gate of the power element through the gate resistor; and
    a control section configured to turn on/off the power element based on the insulation output signal and to generate the control signal for suppressing a surge voltage when the power element is turned on/off, comprising,
        means for varying the insulation output signal such that a time that is required until a gate terminal voltage of the power element reaches a predetermined potential is adapted to the intrinsic capacitance of the power element.

5. A unit for driving a self-arc-extinguishing power element having a collector, an emitter and a gate, comprising:
    a signal generation circuit which generates a signal for turning on/off the power element;
    an insulation circuit configured to insulate an output of the signal generation circuit electrically and to generate an insulation output signal;
    a power amplifier having a gate resistor and configured to amplify a control signal and to supply an amplified signal to the gate of the power element through the gate resistor; and a control section configured to turn on/off the power element based on the insulation output signal and to generate the control signal for suppressing a surge voltage when the power element is turned on/off comprising,     an integration circuit provided on an output side of the insulation circuit, and     means for generating a signal for controlling at least one of rise time and fall time of a current flowing through the power element based on a voltage which is proportionate to an output value of the integration circuit.

6. A unit for driving a self-arc-extinguishing power element having a collectors an emitter, a gate, and an intrinsic capacitance, comprising:

a signal generation circuit which generates a signal for turning on/off the power element;

an insulation circuit configured to insulate an output of the signal generation circuit electrically and to generate an insulation output signal;

a power amplifier having a gate resistor and configured to amplify a control signal and to supply an amplified signal to the gate of the power element through the gate resistor; and a control section configured to turn on/off the power element based on the insulation output signal and to generate the control signal for suppressing a surge voltage when the power element is turned on/off, comprising,     an integration circuit provided on an output side of the insulation circuit, and     means for varying an output of the integration circuit such that time required until a gate voltage of the power element reaches a predetermined potential is adapted to the intrinsic capacitance of the power element.

7. A unit for driving a self-arc-extinguishing power element having a collector, an emitter, and a gate, comprising:

a signal generation circuit which generates a signal for turning on/off the power element;

an insulation circuit configured to insulate an output of the signal generation circuit electrically and to generate an insulation output signal;

a power amplifier having a gate resistor and configured to amplify a control signal and to supply an amplified signal to the gate of the power element through the gate resistor;

a current detecting pilot element which is connected to the power element and produces a pilot output proportionate to a current flowing through the power element; and a control section configured to turn on/off the power element based on the insulation output signal and to generate the control signal for suppressing a surge voltage when the power element is turned on/off, comprising,     means for causing a current corresponding to an input of the power amplifier to flow through the pilot element, and     means for generating a signal for controlling at least one of rise time and fall time of a current flowing through the power element based on an output of the means for causing a current.

8. A unit for driving a self-arc-extinguishing power element having a collector, an emitter and a gate, comprising:

a signal generation circuit which generates a signal for turning on/off the power element;

an insulation circuit configured to insulate an output of the signal generation circuit electrically and to generate an insulation output signal;

a power amplifier having a gate resistor and configured to amplify a control signal and to supply an amplified signal to the gate of the power element through the gate resistor; and a control section configured to turn on/off the power element based on the insulation output signal and to generate the control signal for suppressing a surge voltage when the power element is turned on/off, comprising,     an integration circuit provided on an output side of the insulation circuit, and     means for generating a signal for setting a gate voltage of the power element to a voltage proportionate to an output voltage of the integration circuit in order to suppress an increase in a gate voltage generated when the power element is short-circuited.

9. A unit for driving a self-arc-extinguishing power element having a collector an emitter and a gate, comprising:

a signal generation circuit which generates a signal for turning on/off the power element;

an insulation circuit configured to insulate an output of the signal generation circuit electrically and to generate an insulation output signal;

a power amplifier having a gate resistor and configured to amplify a control signal and to supply an amplified signal to the gate of the power element through the gate resistor; and a control section configured to turn on/off the power element based on the insulation output signal and to generate the control signal for suppressing a surge voltage when the power element is turned on/off, comprising,     an integration circuit provided on an output side of the insulation circuit, and     means for generating a signal for suppressing an increase in a gate voltage generated when a gate voltage of the power element reaches a predetermined clamp potential and when the power element is short-circuited.

10. A unit for driving a self-arc-extinguishing power element having a collector, an emitter and a gate, comprising:

a signal generation circuit which generates a signal for turning on/off the power element;

an insulation circuit configured to insulate an output of the signal generation circuit electrically and to generate an insulation output signal;

a power amplifier having a gate resistor and configured to amplify a control signal and to supply an amplified signal to the gate of the power element through the gate resistor;

a sensor configured to sense a current of the power element; and a control section configured to turn on/off the power element based on the insulation output signal and to generate the control signal for suppressing a surge voltage when the power element is turned on/off, comprising,     means for generating a signal for controlling at least one of rise time and fall time of the current flowing through the power element.

* * * * *